(12) United States Patent
Ooishi

(10) Patent No.: US 6,210,815 B1
(45) Date of Patent: Apr. 3, 2001

(54) ORGANIC THIN FILM EL DEVICE AND METHOD FOR MAKING THE SAME

(75) Inventor: Mitsuma Ooishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/212,483

(22) Filed: Dec. 16, 1998

(30) Foreign Application Priority Data

Dec. 17, 1997 (JP) ...................................... 9-348038

(51) Int. Cl.[7] .............................. H05B 33/04; H05B 33/14
(52) U.S. Cl. .............................. 428/690; 428/68; 428/76; 428/917; 427/516; 427/66; 156/275.5; 313/506; 313/504; 313/512; 257/100
(58) Field of Search ..................................... 428/690, 917, 428/68, 76; 427/508, 516, 66; 156/275.3, 275.5, 275.7; 313/506, 512, 504; 257/100

(56) References Cited

U.S. PATENT DOCUMENTS

| 5,356,698 | * | 10/1994 | Kawamoto et al. | 428/209 |
| 5,909,081 | * | 6/1999 | Eida et al. | 313/504 |
| 5,981,092 | * | 11/1999 | Arai et al. | 428/690 |

FOREIGN PATENT DOCUMENTS 62-231927   10/1987   (JP) .
2-73229     3/1990    (JP) .

OTHER PUBLICATIONS

JPO abstract of JP 02073229 A, Mar. 1990.*
JPO abstract of JP 62231927 A, Oct. 1987.*

* cited by examiner

*Primary Examiner*—William Krynski
*Assistant Examiner*—Dawn L. Garrett
(74) *Attorney, Agent, or Firm*—Sughrue, Mion, Zinn, Macpeak & Seas, PLLC

(57) ABSTRACT

Disclosed is an organic thin film EL device which has: a transparent insulative substrate and a sealing cap which are bonded together by an ultraviolet-activated adhesive; wherein the ultraviolet-activated adhesive is composed of a combination of adhesives with different hardening conditions to the irradiation of ultraviolet rays. Also disclosed is a method for making an organic thin film EL device composed of a transparent insulative substrate and a sealing cap which are bonded together by an ultraviolet-activated adhesive, the method having the steps of: disposing a plurality of the ultraviolet-activated adhesives with different hardening conditions to the irradiation of ultraviolet rays between the transparent insulative substrate and the sealing cap; and irradiating ultraviolet rays with different irradiation conditions to the plurality of the ultraviolet-activated adhesives in a plurality of separate steps so that the adhesives with different hardening conditions are hardened separately in each of the plurality of separate steps.

6 Claims, 3 Drawing Sheets

ORGANIC THIN FILM EL DEVICE AND METHOD FOR MAKING THE SAME

FIELD OF THE INVENTION

This invention relates to an organic thin film EL(electroluminescence) device and a method for making the same.

BACKGROUND OF THE INVENTION

Japanese patent application laid-open No. 2-73229 (1990) discloses a structure of liquid-crystal display panel where thermosetting sealing agent is used in side and ultraviolet-activated sealing agent is used outside.

The glass transfer temperature of organic materials used for organic thin film EL device is around 100° C., and it is generally necessary to apply a temperature of higher than 100° C. for several hours to harden thermosetting adhesives. Therefore, it may cause the deterioration in luminous characteristic.

Also, in organic thin film EL device, when bonding a glass substrate and a sealing cap using an ultraviolet-activated adhesive, hardening the adhesive, and then thermo-compression bonding a flexible print-circuit board, there may occur peeling between the hardened adhesive and the glass substrate due to a difference in thermal expansion coefficient between the hardened adhesive and the glass substrate. For example, when applying a temperature of higher than 200° C. at a distance of less than about 5 mm from the hardened adhesive, peeling is likely to occur between the hardened adhesive and the glass substrate.

When the distance between the flexible print-circuit and the ultraviolet-activated adhesive is widened to solve the above problem, there occurs the problem that the display area is reduced.

Japanese patent application laid-open No.62-231927 (1987) discloses a method that, in liquid-crystal display panel, temporary bonding is conducted by irradiating ultraviolet rays on part of sealing material, then hardening all parts thereof.

Also in organic thin film EL device, a method that part of the same adhesive is hardened, thermo-compression bonding the flexible print-circuit board, then hardening all parts of the adhesive as disclosed in Japanese patent application laid-open No.62-231927 can be imagined.

However, when unalteredly applying the technique disclosed in Japanese patent application laid-open No.62-231927 to the organic thin film EL device, different stresses, which are caused by the contraction of adhesive due to its hardening, are applied to first and second adhering parts. Therefore, the adhesive power is more reduced than the case that all part of adhesive is hardened at once.

SUMMARY OF THE INVENTION

Accordingly, it is an object of the invention to provide an organic thin film EL device where the stress applied to adhering part is absorbed not to reduce the adhesive power.

It is a further object of the invention to provide a method for making an organic thin film EL device where the stress applied to adhering part is absorbed not to reduce the adhesive power.

According to the invention, an organic thin film EL device, comprises:

a transparent insulative substrate and a sealing cap which are bonded together by an ultraviolet-activated adhesive;

wherein the ultraviolet-activated adhesive is composed of a combination of adhesives with different hardening conditions to the irradiation of ultraviolet rays.

According to another aspect of the invention, an organic thin film EL device, comprises:

a transparent insulative substrate and a sealing cap which are bonded together by an ultraviolet-activated adhesive;

wherein the ultraviolet-activated adhesive is composed of a combination of a first adhesive to be hardened by a smaller irradiation amount of ultraviolet rays and a second adhesive to be hardened by a larger irradiation amount of ultraviolet rays.

According to another aspect of the invention, an organic thin film EL device, comprises:

a transparent insulative substrate and a sealing cap which are bonded together by an ultraviolet-activated adhesive;

wherein the ultraviolet-activated adhesive is composed of a combination of a first adhesive to be hardened by a smaller irradiation amount of ultraviolet rays, a second adhesive to be hardened by a larger irradiation amount of ultraviolet rays, and a third adhesive to be hardened by a medium irradiation amount of ultraviolet rays.

According to another aspect of the invention, a method for making an organic thin film EL device composed of a transparent insulative substrate and a sealing cap which are bonded together by an ultraviolet-activated adhesive, comprises the steps of:

disposing a plurality of the ultraviolet-activated adhesives with different hardening conditions to the irradiation of ultraviolet rays between the transparent insulative substrate and the sealing cap; and irradiating ultraviolet rays with different irradiation conditions to the plurality of ultraviolet-activated adhesives in a plurality of separate steps so that the adhesives with different hardening conditions are hardened separately in each of the plurality of separate steps.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
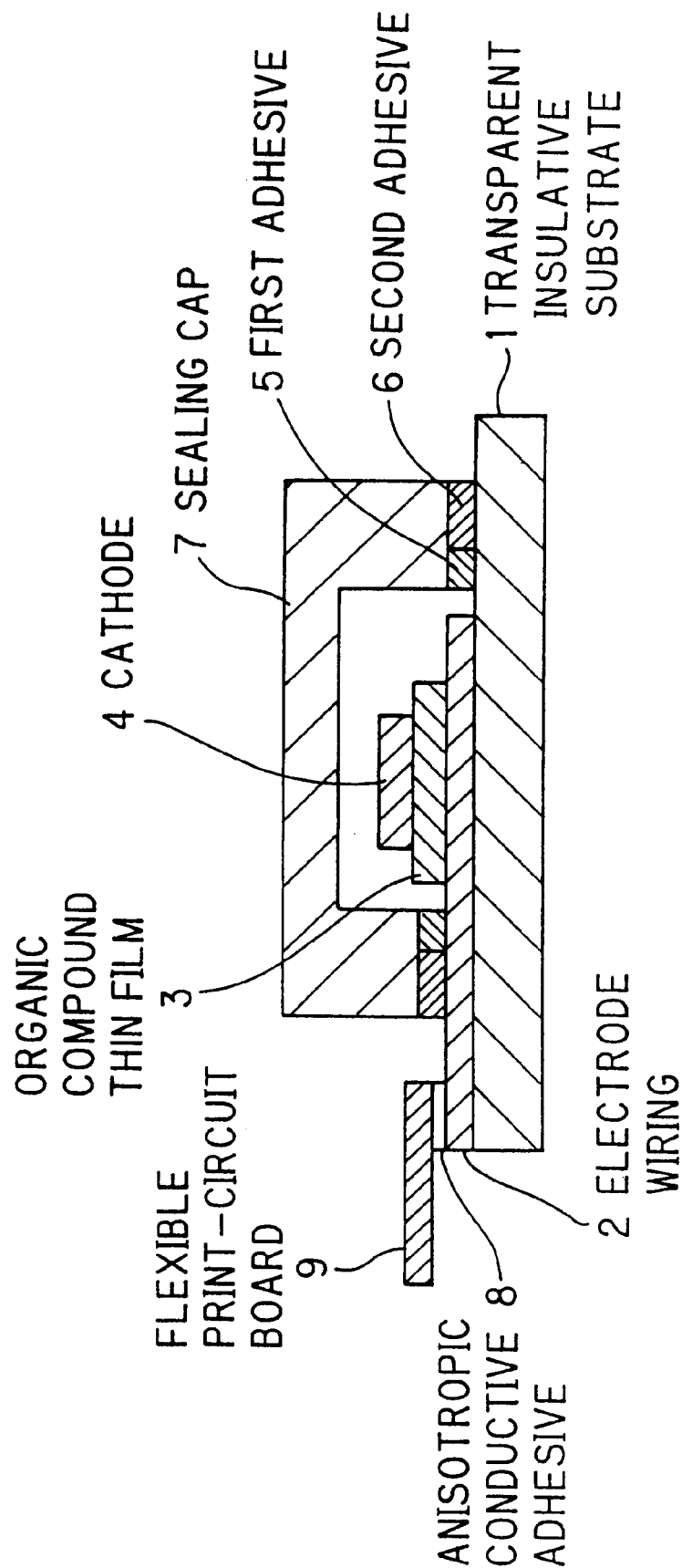
FIG. 1 is a cross sectional view showing an organic thin film EL device in a first preferred embodiment according to the invention.

The preferred embodiments will be explained below referring to the drawings.

FIG. 1 is a cross sectional view showing an organic thin film EL device in the first preferred embodiment of the invention.

In FIG. 1, the organic thin film EL device of the invention has a basic composition where a transparent insulative substrate and a sealing cap are bonded by an ultraviolet-activated adhesive, which is a combination of adhesives with different ultraviolet-hardening conditions.

Also, a method for making the organic thin film EL device, which has a basic composition where a transparent insulative substrate and a sealing cap are bonded by an ultraviolet-activated adhesive, of the invention has the steps of: disposing adhesives with different ultraviolet-hardening conditions between the transparent insulative substrate and the sealing cap; and irradiating ultraviolet rays with different irradiation conditions to the adhesives in a plurality of separate steps so that the adhesives with different ultraviolet-hardening conditions are hardened separately in each of the plurality of separate steps.

Figure 2:
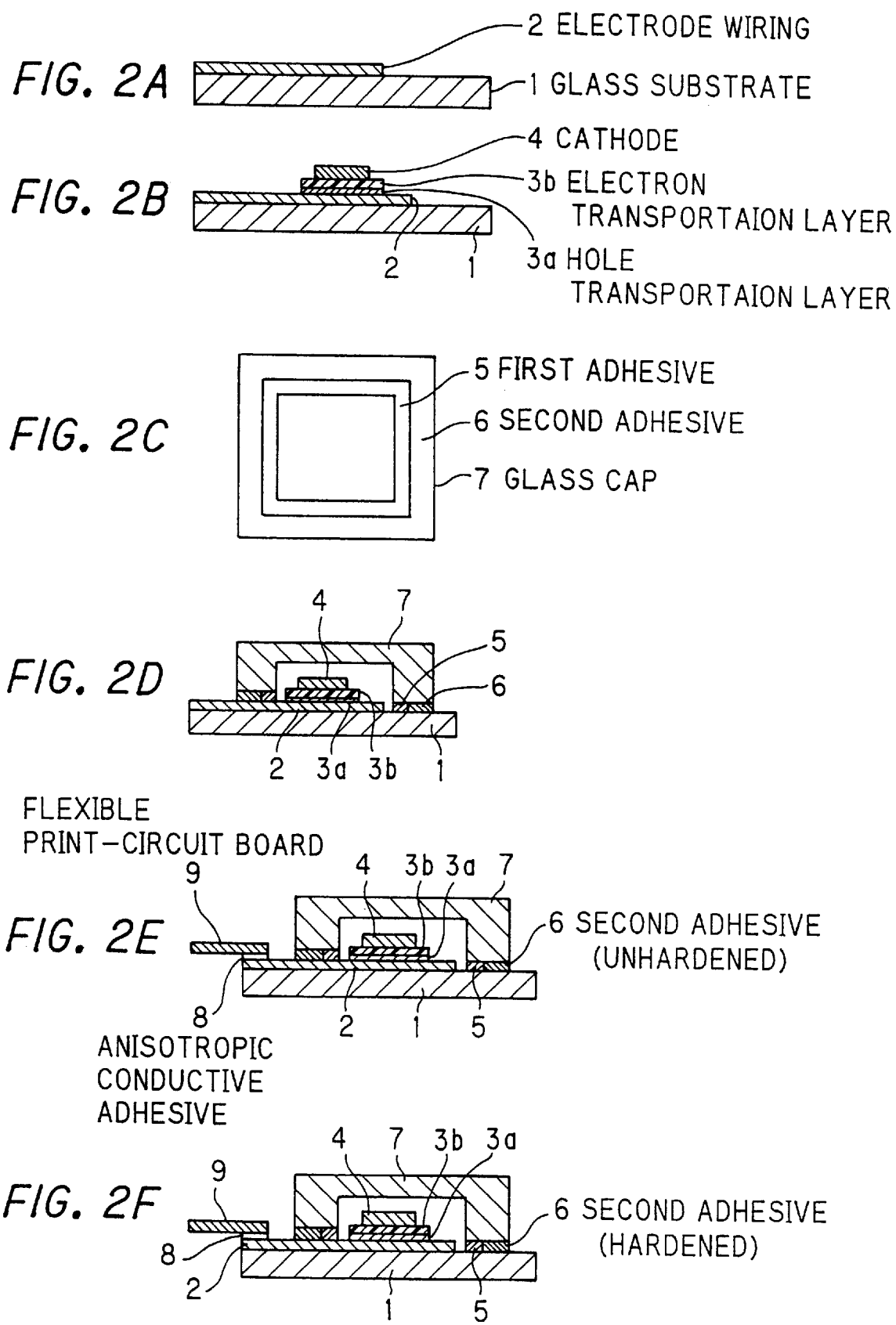
FIGS. 2A and 2B are cross sectional views showing a method for making the organic thin film EL device in the first preferred embodiment according to the invention.
FIG. 2C is a bottom view showing a sealing cap used in the method for making the organic thin film EL device in the first preferred embodiment according to the invention.
FIGS. 2D, 2E and 2F are cross sectional views showing the method for making the organic thin film EL device in the first preferred embodiment according to the invention.

Next, the organic thin film EL device and the method for making the same in the first embodiment of the invention will be explained in FIGS. 1 and 2.

In the organic thin film EL device in the first embodiment of the invention, as shown in FIG. 1, a transparent electrode wiring 2 is formed on a transparent insulative substrate 1, organic-compound thin film 3 is formed on part of the electrode wiring 2. This organic-compound thin film 3 has a single-layer or laminated structure and presents EL luminous phenomenon. A method used to form this film is vacuum vapor deposition or spin coating.

Further, a cathode 4 of conductive metal is formed on the organic-compound thin film 3. As the material of the cathode, an alloy of metal with small work function, such as magnesium-silver or magnesium-indium is used.

Further, the organic-compound thin film 3 and the cathode 4 are covered with a sealing cap 7, the lower opening end of the sealing cap 7 is bonded to the substrate, thereby the organic-compound thin film 3 and the cathode 4 are air-tight sealed.

In the first embodiment of the invention, two kinds of adhesives, which can be hardened by ultraviolet rays, are used as the adhesive to bond the lower opening end of the sealing cap 7 to the substrate. These two kinds of adhesives are composed of a combination of a first adhesive 5 and a second adhesive 6.

The first adhesive 5 can be hardened by a smaller irradiation amount of ultraviolet rays, and the second adhesive 6 can be hardened by a larger irradiation amount of ultraviolet rays. Disposing the first adhesive 5 inside and the second adhesive 6 outside, the lower opening end of the sealing cap 7 is bonded to the substrate.

In bonding the lower opening end of the sealing cap 7 to the substrate, the first adhesive 5 is first hardened by irradiating ultraviolet rays with the lower mount of irradiation, and then the flexible print-circuit board 9 is thermo-compression-bonded to the electrode wiring 2 on the transparent insulative substrate 1 using an anisotropic conductive adhesive 8 with the hardened first adhesive 5 and the unhardened second adhesive 6. The unhardened second adhesive 6 is hardened by further irradiating ultraviolet rays, thereby the organic thin film EL device is obtained.

Next, the method for making the organic thin film EL device in the first embodiment of the invention will be explained in FIGS. 2A to 2F.

As shown in FIG. 2A, indium-tin oxide (ITO) is, at first, sputtered by 20 nm on the glass substrate (transparent insulative substrate) of 1.1 mm thick, the transparent electrode wiring 2 is formed by lithography and wet-etching.

Then, as shown in FIG. 2B, the organic-compound thin film 3 and the cathode 4 are deposited on part of the electrode wiring 2 by vacuum vapor deposition. Explaining in detail, the organic-compound thin film 3 has a laminated structure of a hole transportation layer 3a, and a luminous layer and electron transportation layer 3b. In fabricating the organic-compound thin film 3, 50 nm diamine derivative (TPD) as the hole transportation layer 3a and 50 nm tris (8-quinolinol) aluminum ($Alq_3$) as the luminous layer and electron transportation layer 3b are first deposited. Then, magnesium and iridium is concurrently deposited, thereby the 200 nm thick cathode 4 of the alloy with atomic ratio of 10:1 is laminated thereon.

Then, as shown in FIG. 2C, the first adhesive 5, which is of resin mainly composed of epoxy to be hardened by an accumulated light amount of about 1500 $mJ/cm^2$ at a wavelength of 350 nm, to be hardened by the smaller irradiation amount of ultraviolet rays, and the second adhesive 6, which is of resin mainly composed of epoxy to be hardened by an accumulated light amount of about 6000 $mJ/cm^2$ at wavelength of 350 nm, to be hardened by the larger irradiation amount of ultraviolet rays are applied to the lower opening end 7a of the glass cap 7 as a sealing cap. In this process, the second adhesive 6 to be hardened by the larger irradiation amount of ultraviolet rays is applied outside and neighboring to the thermo-compression, and the first adhesive 5 to be hardened by the smaller irradiation amount of ultraviolet rays is applied inside of the adhering part. Also, it is desirable that the first adhesive 5 to be hardened by the smaller irradiation amount of ultraviolet rays has a width of 0.5 to 1.0 mm and the second adhesive 6 to be hardened by the larger irradiation amount of ultraviolet rays has a width of greater than half the entire width of the adhering part.

Then, as shown in FIG. 2D, the glass substrate 1 and the glass cap 7 are bonded together in an inert gas atmosphere, applying a pressure of 1 $kg/cm^2$ to the adhering part of the glass substrate 1 and the glass cap 7 by using a jig and a 15 mm quartz glass, irradiating ultraviolet rays thereon.

In the irradiation of ultraviolet rays, ultraviolet rays with a lighting intensity of about 100 $mW/cm^2$ at wavelength of 350 nm are first irradiated by high-pressure mercury lamp for 30 sec. Thereby, ultraviolet rays of about 1500 $mJ/cm^2$ are irradiated to the first and second adhesives 5, 6 because the lighting intensity of ultraviolet rays transmitted through the quartz glass and the glass cap 7 is reduced to about 50%. Therefore, the first adhesive 5 is almost hardened and the second adhesive 6 is in majority unhardened. In the first irradiation of ultraviolet rays, it is desirable that the hardening reaction of the first adhesive 5 is more than 95% and the hardening reaction of the second adhesive 6 is less than 50%.

Then, as shown in FIG. 2E, in the state that the first adhesive 5 is almost hardened and the second adhesive 6 is in majority unhardened through the smaller irradiation amount of ultraviolet rays, the flexible print-circuit board 9 and the electrode wiring 2 on the glass substrate 1 are bonded using an anisotropic conductive adhesive 8 by thermo-compression. In detail, the flexible print-circuit board 9, which is about 3 mm distant from the unhardened second adhesive 6, on the anisotropic conductive adhesive 8 is pressed at 250° C. for 20 sec.

Then, as shown in FIG. 2F, pressure of 1.2 $kg/cm^2$ is again applied to the adhering part of the glass substrate 1 and the glass cap 7 by using the jig and 15 mm thick quartz glass, conducting the second irradiation of ultraviolet rays. Irradiating ultraviolet rays of about 4500 $mJ/cm^2$ on the first and second adhesives 5, 6, ultraviolet rays of about 6000 mJ/cm$^2$ as the sum of the first and second irradiations are irradiated. By the second irradiation, the second adhesive 6 is completely hardened.

Although in the first embodiment ultraviolet rays are irradiated from the side of the glass cap 7, they may be irradiated form the side of the glass substrate 1.

In the first embodiment of the invention composed as explained above, the second adhesive 6 is not peeled from the glass substrate 1 because the anisotropic conductive adhesive 8 is subject to the thermo-compression in the state that the second adhesive 6 is unhardened. Also, the glass cap 7 is not displaced from the glass substrate 1 because the anisotropic conductive adhesive 8 is subject to the thermo-compression in the state that the first adhesive 5 is hardened. Therefore, it is easy to handle them in the process.

Also, due to the arrangement that the first adhesive 5 is disposed inside and the second adhesive 6 is disposed outside in bonding the transparent insulative substrate and the sealing cap, the stress occurred when the first adhesive 5 is hardened can be absorbed by the second adhesive 6, thereby preventing the reduction of adhesive power.

Figure 3:
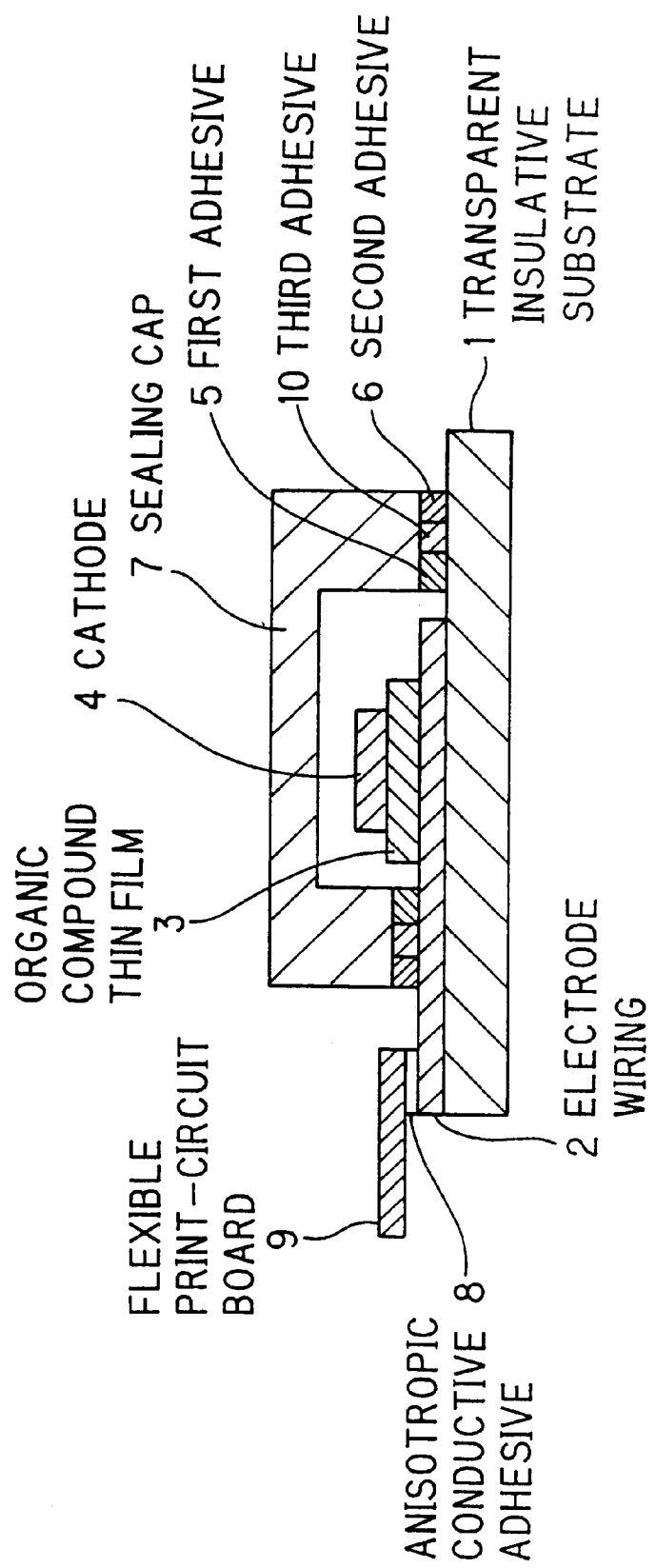
FIG. 3 is a cross sectional view showing an organic thin film EL device in a second preferred embodiment according to the invention.

FIG. 3 is a cross sectional view showing the second preferred embodiment of the invention. In the second embodiment, as shown in FIG. 3, three kinds of ultraviolet-activated adhesives, i.e., the first adhesive 5 to be hardened by the smaller irradiation amount of ultraviolet rays, the second adhesive 6 to be hardened by the larger irradiation amount of ultraviolet rays, and a third adhesive 10 to be hardened by a medium irradiation amount of ultraviolet rays, are used to bond the glass substrate 1 and the glass cap 7.

The third adhesive 10 is disposed between the first adhesive 5 disposed inside and the second adhesive 6 disposed outside, thereby the transparent insulative substrate and the sealing cap are bonded.

The contraction percentage by hardening and the thermal expansion ratio of the third adhesive 10 are set to be values in the middle of those of the first and second adhesives, respectively. Thereby, comparing with the case that the first and second adhesives are disposed next to each other like the first embodiment, the reduction of adhesive power due to the stress by hardening contraction and the reduction of reliability in the organic thin film EL device due to a variation in temperature can be prevented. Meanwhile, the third adhesive 10 may be a mixture of the first and second adhesives.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An organic thin film EL device, comprising:

a transparent insulative substrate and a sealing cap which are bonded together by an ultraviolet-activated adhesive;

wherein said ultraviolet-activated adhesive is composed of a combination of adhesives with different hardening conditions to the irradiation of ultraviolet rays.

2. An organic thin film EL device, comprising:

a transparent insulative substrate and a sealing cap which are bonded together by an ultraviolet-activated adhesive;

wherein said ultraviolet-activated adhesive is composed of a combination of a first adhesive to be hardened by a smaller irradiation amount of ultraviolet rays and a second adhesive to be hardened by a larger irradiation amount of ultraviolet rays.

3. An organic thin film EL device, according to claim 2, wherein:

said first adhesive is disposed inside of the adhering part between said transparent insulative substrate and said sealing cap and said second adhesive is disposed outside of said adhering part.

4. An organic thin film EL device, comprising:

a transparent insulative substrate and a sealing cap which are bonded together by an ultraviolet-activated adhesive;

wherein said ultraviolet-activated adhesive is composed of a combination of a first adhesive to be hardened by a smaller irradiation amount of ultraviolet rays, a second adhesive to be hardened by a larger irradiation amount of ultraviolet rays, and a third adhesive to be hardened by a medium irradiation amount of ultraviolet rays.

5. An organic thin film EL device, according to claim 4, wherein:

said third adhesive is disposed between said first adhesive disposed inside of the adhering part between said transparent insulative substrate and said sealing cap and said second adhesive disposed outside of said adhering part.

6. A method for making an organic thin film EL device composed of a transparent insulative substrate and a sealing cap which are bonded together by an ultraviolet-activated adhesive, comprising the steps of:

disposing a plurality of said ultraviolet-activated adhesives with different hardening conditions to the irradiation of ultraviolet rays between said transparent insulative substrate and said sealing cap; and irradiating ultraviolet rays with different irradiation conditions to said plurality of the ultraviolet-activated adhesives in a plurality of separate steps so that said adhesives with different hardening conditions are hardened separately in each of said plurality of separate steps.

\* \* \* \* \*